United States Patent
Magnusen et al.

(10) Patent No.: US 7,636,559 B2
(45) Date of Patent: Dec. 22, 2009

(54) RF FILTER ADJUSTMENT BASED ON LC VARIATION

(75) Inventors: Timothy M. Magnusen, Murphy, TX (US); Jan-Michael Stevenson, Frisco, TX (US)

(73) Assignee: Microtune (Texas), L.P., Plano, TX (US)

( * ) Notice: Subject to any disclaimer, the term of this patent is extended or adjusted under 35 U.S.C. 154(b) by 458 days.

(21) Appl. No.: 11/513,520

(22) Filed: Aug. 31, 2006

(65) Prior Publication Data

US 2008/0057897 A1 Mar. 6, 2008

(51) Int. Cl.
H04B 1/26 (2006.01)
(52) U.S. Cl. .................................... 455/266; 455/307
(58) Field of Classification Search ............... 455/205, 455/255, 257, 258, 266, 307, 310; 333/16, 333/100
See application file for complete search history.

(56) References Cited

U.S. PATENT DOCUMENTS

| | | | |
|---|---|---|---|
| 3,281,698 A | 10/1966 | Rose, Jr. et al. | |
| 3,626,285 A | 12/1971 | Hartke | |
| 5,204,972 A * | 4/1993 | Hashimoto | 455/207 |
| 5,972,633 A | 10/1999 | Franke et al. | |
| 5,973,633 A | 10/1999 | Hester | |
| 6,285,865 B1 | 9/2001 | Vorenkamp et al. | |
| 6,750,565 B2 | 6/2004 | Degen et al. | |
| 6,784,754 B1 | 8/2004 | Cheng | |
| 2002/0105331 A1 | 8/2002 | Brune et al. | |
| 2002/0126792 A1 | 9/2002 | Fuhrmann et al. | |
| 2003/0025563 A1* | 2/2003 | Christensen | 331/100 |
| 2003/0076139 A1 | 4/2003 | Miyagawa et al. | |
| 2005/0052225 A1 | 3/2005 | Cusinato | |

FOREIGN PATENT DOCUMENTS

| | | |
|---|---|---|
| EP | 1 282 227 A2 | 2/2003 |
| EP | 1 596 208 | 11/2005 |
| GB | 2 258 048 | 1/1993 |

OTHER PUBLICATIONS

International Search Report and Written Opinion issued for PCT/US2007/075686; Dated: Apr. 17, 2008; 12 Pages.
U.S. Appl. No. 11/441,816, Stevenson et al.
U.S. Appl. No. 11/513,521, Stevenson et al.
U.S. Appl. No. 11/513,550, Stevenson et al.
International Search Report and Written Opinion issued for PCT/US2007/075671 dated Mar. 14, 2008, 10 pgs.
International Search Report and Written Opinion issued for PCT/US2007/075677 dated Apr. 3, 2008, 17 pgs.
Xin, He et al., "A 2.5 GHz Low-Power, High Dynamic Range, Self-Tuned Q-Enhanced LC Filter in SOI", IEEE Journal of Solid-State Circuits, IEEE Service Center, Piscataway, NJ, US, vol. 40. No. 8, Aug. 2005, 11 pgs.

(Continued)

Primary Examiner—Thanh C Le
(74) Attorney, Agent, or Firm—Fulbright & Jaworski L.L.P.

(57) ABSTRACT

A system for processing a signal comprises a Radio Frequency (RF) signal tuner, one or more filters in a signal path of the RF tuner each based on Inductive/Capacitive (LC) circuitry, a variation unit operable to measure a variation of the LC circuitry, and a frequency control unit adapted to adjust the one or more filters based on the LC variation during operation of the tuner.

25 Claims, 2 Drawing Sheets

OTHER PUBLICATIONS

Li, Shaorui et al., "An Integrated 1.5 V 6 GHz Q-Enhanced LC CMOS Filter with Automatic Quality Factor Tuning USing Conductance Reference", Radio Frequency Integrated Circuits (RFIC) Syposium, 2005, Digest of Papers, 2005 IEEE, Long Beach, CA, USA, Jun. 12-14, 2005, Piscataway, NJ, USA, Jun. 12, 2005, 4 pgs.

U.S. Office Action issued for U.S. Appl. No. 11/513,521 dated Jan. 6, 2009, 18 pgs.

U.S. Office Action issued for U.S. Appl. No. 11/513,521 dated Jun. 26, 2008, 13 pgs.

U.S. Office Action issued for U.S. Appl. No. 11/513,550 dated Feb. 23, 2009, 6 pgs.

* cited by examiner

RF FILTER ADJUSTMENT BASED ON LC VARIATION

CROSS-REFERENCE TO RELATED APPLICATIONS

This application is related to U.S. patent application Ser. No. 11/513,521, filed Aug. 31, 2006, entitled "SYSTEMS AND METHODS FOR DETECTING CAPACITOR PROCESS VARIATION," and to U.S. patent application Ser. No. 11/513,550, filed Aug. 31, 2006, entitled "SYSTEMS AND METHODS FOR FILTER CENTER FREQUENCY LOCATION," the disclosures of which are hereby incorporated herein by reference.

TECHNICAL FIELD

This description relates, in general, to RF filters, and, more specifically, to adjusting a frequency response of one or more filters based at least in part on LC variation.

BACKGROUND OF THE INVENTION

Currently, it is common to form various systems on semiconductor chips. General purpose processors, digital signal processors, Application Specific Integrated Circuits (ASICs), and the like are manufactured by forming a variety of transistors, memory elements, resistors, capacitors, inductors, etc., on a semiconductor substrate.

The processes that are used to form the circuit elements on a semiconductor substrate are sometimes less than ideal and cause some amount of process variation in the circuit elements. Variation, in general, is the difference between an actual quality of a circuit element and its nominal quality. For instance, capacitors formed in semiconductor chips tend to have process variation of up to approximately plus or minus 20%, depending on the fabrication process. Thus, the actual capacitance of a given capacitor on a chip, measured in Farads, may be significantly different from the intended or nominal value specified in the design. Inductors formed on semiconductor chips also generally experience some amount of variation, though less than that for capacitors, even on the same chip. Variation can also be a result of component temperature, age of components, and the like.

One application that uses capacitors is a tuner circuit. Specifically, such tuner circuits may include input filtering functions to condition input signals before they are passed to other tuner components. Most such filters are Inductive-Capacitive (LC) circuits. The frequency response of a given LC filter depends on the values of the capacitor(s) and inductor(s) in the circuit. Thus, capacitor variation can cause frequency response shifts in filters, causing non-ideal operation.

Tuners typically have Radio Frequency (RF) filters near the beginning of the signal path and Intermediate Frequency (IF) filters closer to the end of the signal path. When formed wholly or partly on a chip, such filters experience differences in their frequency responses due to the process variation. Currently, there is no technique offered that adjusts filters in the signal path based, at least in part, on LC variation during operation of a tuner.

BRIEF SUMMARY OF THE INVENTION

The present invention is directed to systems and methods which adjust a filter in response to process variation. In one example, LC variation is measured and one or more filters are adjusted in response thereto. For example, adjustable filters can include a plurality of switchable LC elements providing discrete, selectable frequency responses, wherein the elements are switched out at increasing frequency switching points. In such a case, adjusting one or more filters can include changing frequency switching points for the switchable elements in the filter to compensate for the LC variation. One application is adjustment of RF filters in a signal path of an RF tuner, though various embodiments of the invention can be used to adjust any LC component with a selectable response. Various embodiments of the invention can provide real-time adjustment of a tuner, for example, at each channel change.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which.

DETAILED DESCRIPTION OF THE INVENTION

Figure 1:
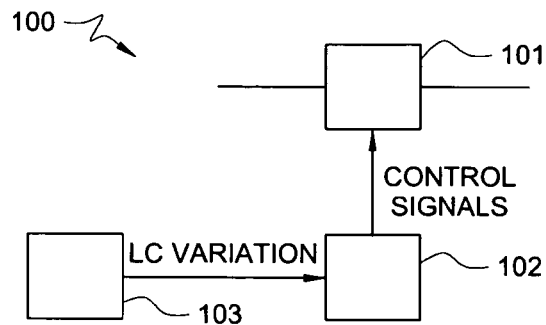
FIG. 1 is an illustration of an exemplary system adapted according to one embodiment of the invention.

FIG. 1 is an illustration of exemplary system 100 adapted according to one embodiment of the invention. System 100 include filter 101, control unit 102, and Inductive/Capacitive (LC) variation unit 103. LC variation unit 103 is adapted to measure a variation of LC circuitry. Control unit 102 is adapted to adjust filter 101 based at least in part on the measured LC variation. While filter 101, control unit 102, and LC variation unit 103 are shown as separate items, the invention is not so limited, as various embodiments may combine one or more of the items. Also control unit 102, and LC variation unit 103 may be hardware-based, software based, or a combination thereof.

Figure 2:
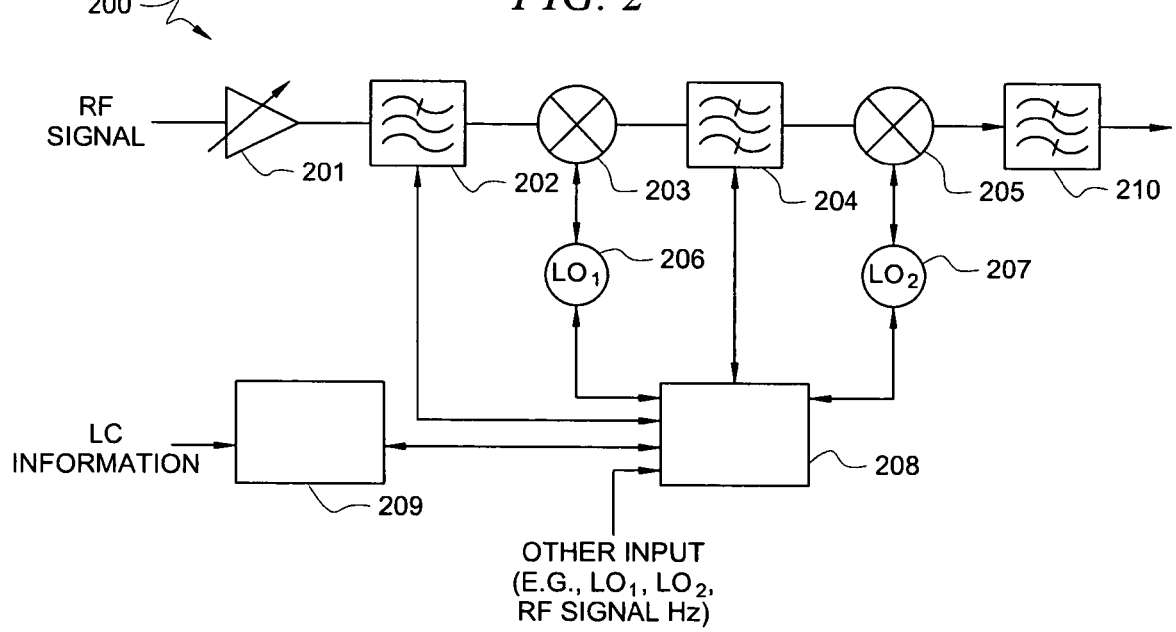
FIG. 2 is an illustration of an exemplary tuner system adapted according to one embodiment of the invention for adjusting a tuner.

FIG. 2 is an illustration of exemplary tuner system 200 adapted according to one embodiment of the invention. System 200 includes Low Noise Amplifier (LNA) 201, receiving as input a Radio Frequency (RF) signal. The output of LNA 201 is sent to RF filter 202, which filters out some unwanted frequencies and sends the filtered signal to mixer 203. Mixer 203 is controlled by local oscillator 206. The mixed signal is sent to first IF filter 204, which removes signals outside of a pass band. Then the first IF signal is sent to mixer 205, which is controlled by local oscillator 207. The output from mixer 205 is sent to second IF filter 210. The output of second IF filter 210 is an IF signal that includes the channel of interest. The output of filter 210 may be sent to a demodulator unit (not shown).

Frequency Control Unit (FCU) 208 controls local oscillators 206 and 207 and filters 202, 204, and 210. LC variation determination unit 209 receives LC data, determines an LC variation therefrom, and sends information indicating the LC variation to frequency control unit 208. FCU 208 is adapted to adjust RF filter 202 based on the LC variation during operation of the tuner. For example, as the tuner is operating, the user may change the frequency band of interest. The tuner locks onto the new frequency by, among other things, adjusting RF filter 202 to pass signals that fall within the new band of interest. Since LC process variation affects the performance of LC-based filter 202, FCU 208 accounts for the process variation as it adjusts RF filter 202 by, for example, selecting one or more inductors and capacitors for operation inside filter 202.

System 200 is exemplary, as tuners may conform to a variety of configurations, and such configurations are within the scope of various embodiments. Further, various embodiments of the invention may adjust filters alternatively to or in addition to RF filters at the input of a signal path.

Figure 3:
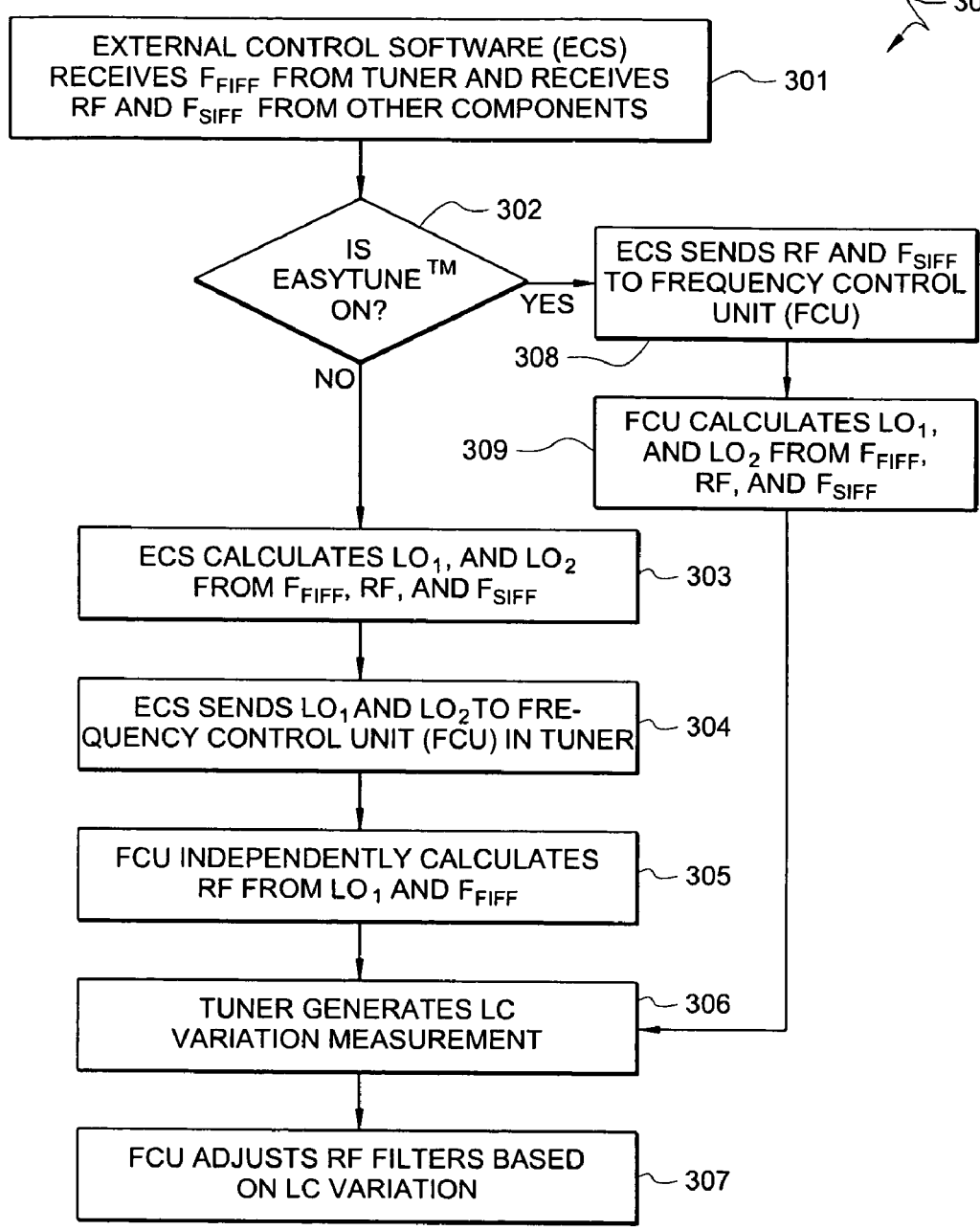
FIG. 3 is an illustration of an exemplary method adapted according to one embodiment of the invention for adjusting a tuner.

FIG. 3 is an illustration of exemplary method 300 adapted according to one embodiment of the invention for adjusting a tuner. In this example, method 300 is performed by one or more components internal or external to the tuner, such as, for example, external control software in communication with the tuner and an FCU or other internal functional tuner unit. While various steps specify a component, it should be noted that method 300 is exemplary only and that other embodiments may perform steps using other components, may perform steps out order, or may even eliminate some steps. The components performing any of the steps in method 300 may be wholly or partially formed on a same semiconductor chip, may be hardware-based, may be made of machine executable code, or may be a combination thereof.

Figure 4:
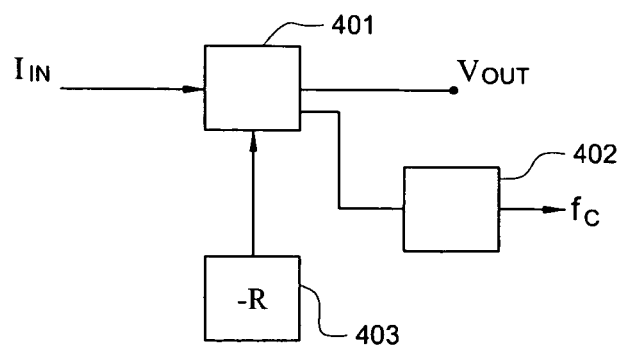
FIG. 4 is an illustration of an exemplary system adapted according to one embodiment of the invention for measuring a filter center frequency.

In step 301, External Control Software (ECS) in communication with the tuner receives a center frequency for a first IF filter ($f_{FIFF}$) from the tuner. In an example embodiment, calculating $f_{FIFF}$ can be performed by temporarily changing the first IF filter into an oscillator and measuring the oscillations, as described in U.S. patent application Ser. No. 11/513,550, filed Aug. 31, 2006, entitled "SYSTEMS AND METHODS FOR FILTER CENTER FREQUENCY LOCATION." FIG. 4 is an illustration of exemplary system 400 adapted according to one embodiment of the invention for measuring a filter center frequency. System 400 operates according to one or more techniques disclosed in U.S. patent application Ser. No. 11/513,550, and it includes filter 401, measuring circuit 402, and negative resistance circuit 403. Negative resistance unit 403 applies negative resistance to at least part of filter 401, thereby changing at least part of filter 401 into an oscillator. Measuring circuit 402 measures the oscillations and calculates a center frequency therefrom.

Other techniques for calculating the center frequency of a filter are possible and within the scope of various embodiments. The ECS also receives a desired RF frequency value (e.g., a value representing a selected television channel) and a value for a center frequency of the second IF filter ($f_{SIFF}$).

Some tuners available from MICROTUNE™, Inc. include a feature called EASYTUNE™, wherein local oscillator frequencies are calculated by the tuner rather than by the ECS. Returning to FIG. 3, step 302 is an acknowledgement that the process may be slightly different when performed by such a tuner than if it was performed in a tuner that did not include the EASYTUNE™ feature. If the tuner includes EASYTUNE™ and if the EASYTUNE™ feature is turned on, method 300 advances to step 308. Otherwise, step 303 is performed. In step 303, the ECS calculates frequencies for LO1 and LO2 from $f_{FIFF}$, the desired RF frequency, and $f_{SIFF}$, wherein LO1 and LO2 are the frequencies of a first and second local oscillator, respectively (e.g., 206 and 207 of FIG. 2). Typically, frequencies for LO1 and LO2 are different for each given desired RF frequency. In this example, LO1 frequency is calculated from the desired RF frequency and $f_{FIFF}$, while LO2 frequency is calculated from $f_{FIFF}$ and $f_{SIFF}$, as shown in equations (1) and (2).

$$LO1 = f_{desired\,RF} + f_{FIFF} \quad (1)$$

$$LO2 = f_{FIFF} - f_{SIFF} \quad (2)$$

Thus, the local oscillator frequencies are adjusted for the actual center frequency of the first IF filter.

In step 304, the ECS sends the LO1 and LO2 frequencies to the FCU of the tuner (e.g, 208 of FIG. 2). It is also possible in some embodiments that sending $f_{FIFF}$ from the tuner to the ECS in step 301 is not performed. In such embodiments, step 304 may include the ECS calculating a nominal LO1 and LO2 frequencies, while the FCU then recalculates LO1 and LO2 frequencies in light of the actual value for $f_{FIFF}$. Any method of calculating LO1 and LO2 frequencies in view of an actual IF center frequency is within the scope of the various embodiments.

In step 305, the FCU independently calculates the desired RF frequency from LO1 frequency and $f_{FIFF}$. In other words, the FCU performs the reverse calculation that is performed in step 303. In some embodiments it may be possible to send the desired RF value to the FCU from the ECS, thereby obviating step 305.

If the tuner has an EASYTUNE™ feature that is turned "on," then steps 307 and 308 are performed in place of steps 303-305. In step 308, the ECS sends the desired RF frequency and the $f_{SIFF}$ to the FCU. In step 309, the FCU calculates LO1 and LO2 frequencies from $f_{FIFF}$, the desired RF frequency, and $f_{SIFF}$. Thus, whether EASYTUNE™ is enabled or not, the tuner will have available to it values that indicate $f_{FIFF}$, $f_{SIFF}$, desired RF frequency, LO1 frequency, and LO2 frequency.

In step 306, the tuner generates an LC variation measurement. LC variation represents the discrepancy between nominal values for capacitors and inductors and the actual values for capacitors and inductors. Such variation can be caused by manufacturing imperfections, device age, temperature, and other factors that may cause a capacitor or inductor to have an effective value that is different from its nominal value. One technique that can be used to generate an LC variation measurement is described in U.S. patent application Ser. No. 11/513,521, filed Aug. 31, 2006, entitled "SYSTEMS AND METHOD FOR DETECTING CAPACITOR PROCESS VARIATION." In U.S. patent application Ser. No. 11/513,521, methods and systems are described that measure variation in an on-chip LC oscillator where the measured variation can be expected of other inductors and capacitors also formed on the same chip.

Figure 5:
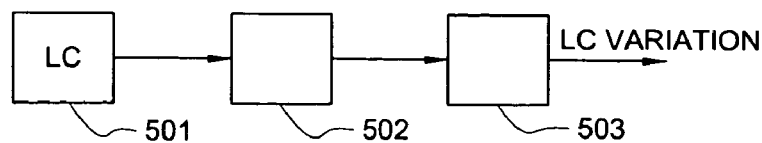
FIG. 5 is an illustration of an exemplary system adapted according to one embodiment of the invention for measuring LC variation.

FIG. 5 is an illustration of exemplary system 500 adapted according to one embodiment of the invention for measuring LC variation. System 500 includes LC oscillator 501, circuit 502 for capturing the output of LC oscillator 501 (e.g., a counter), and computational unit 503 for comparing the captured output to a reference output and to evaluate the variation based thereon. Computational unit 503 outputs a signal indicative of the variation. System 500 can formed on a same semiconductor chip as other circuits that include capacitors and inductors. Thus, the variation evaluated by system 500 can be an accurate measure of variation for other LC circuits in the device.

While U.S. patent application Ser. No. 11/513,521 describes using the LC oscillator variation to calculate a capacitor variation by assuming zero inductor variation, it is possible in some embodiments to use the variation measurement as a measurement for LC variation. Thus, even though it is not easily determined how much of the variation is due to capacitor variation and how much is due to inductor variation, the variation measurement describes a systematic LC variation that can be correlated to other LC components, such as RF filters.

One way to optimize correlation between the LC variation from the on-chip LC oscillator and the other LC devices (including RF filters) is to make most or all of the inductors and capacitors throughout the chip in same or similar sizes and at same or similar orientations while using larger capacitors (because larger capacitors generally have less variation). Thus, a percentage LC variation measurement from the on-chip LC oscillator can be assumed to be present in another LC component with a same or similar LC element. It is also possible to use known relationships between variation and inductor/capacitor size, arrangement, and/or orientation to calculate probable LC variation in other LC components that differ somewhat from the on-chip LC oscillator.

While the technique in U.S. patent application Ser. No. 11/513,521 is described as one way to generate an LC variation measurement, other techniques now known or later developed to measure inductor and/or capacitor variation can be used. For instance, measurements based on time-constant variation can be used.

Returning to FIG. 3, in step 307, the FCU adjusts one or more RF filters based upon the LC variation in order to pass the desired RF frequency. In one example, the RF filter is a filter unit that includes one or more discrete filters that can be selected to pass a signal, wherein each of the discrete filters passes a particular frequency band. The RF filter uses breakpoints—frequency values where one filter is switched out and another is switched in. The FCU then uses the LC variation measurement to adjust the breakpoints. In another embodiment, an RF filter includes a network of inductors and capacitors, wherein each of the inductors and capacitors can be selected by closing a switch. Selecting the inductors and capacitors determines the frequency response of the RF filter, such that the RF filter is an adjustable filter that provides a number of discrete frequency response settings. In one example, an RF filter has two selectable inductors and sixteen selectable capacitors for each of the inductors. A control unit in the FCU uses the LC variation measurement to adjust the breakpoints for selecting the discrete inductors and capacitors to pass the desired RF frequency, thereby compensating for the LC variation. Example techniques for adjusting filters are discussed in U.S. patent application Ser. No. 11/513,521. Any technique now known or later developed to adjust an RE filter can be used in various embodiments if those techniques can be adapted to compensate for measured LC variation.

As mentioned above, various embodiments within the scope of the invention perform methods that differ somewhat from method 300. For instance, there is no requirement that an LC variation measurement be generated after local oscillator frequencies and/or desired RF frequencies are calculated. In fact, LC variation can be performed at any time, including, e.g., at each channel change that the tuner performs, when the tuner is turned on, at periodic intervals, during manufacture of the tuner, and the like. Further, various tuners may use different on- or off-chip components to perform any of the steps shown in method 300, and such variations are within the scope of the invention.

Method 300 describes using an IF filter center frequency to calculate adjusted local oscillator frequencies and using LC variation to adjust one or more RF filters. However, various embodiments of the invention are not so limited. For instance, LC variation can be used in some embodiments to adjust frequency components other than RF filters, provided those components can be appropriately assumed to have an inductor or capacitor variation that bears a relation to the measured LC variation. Such components may include other filters and oscillators. Additionally, if adjustable filters are used as IF filters, it is possible to adjust one or more of those IF filters based at least on part on calculated IF filter center frequency and/or LC variation.

Advantages of some embodiments include, for example, facilitating the real-time adjustment of a tuner during operation. When performed periodically, at channel changes, or other times during operation, various embodiments can compensate for non-ideal operation, even for process variation that changes due to device age, temperature, and other conditions that are not necessarily present at time of manufacture. Another advantage of some embodiments is that the functional units to perform the measuring and adjusting can be included in a tuner system, rather than as an external feature, sometimes even in the same semiconductor chip as other portions of the tuner. This may reduce the chance of error and be more convenient for customers who buy such tuner systems for installation in devices such as cell phones, laptop and desktop computers, televisions, cable receivers, digital video recorders, and the like.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system for processing a signal, said system comprising:
   a Radio Frequency (RF) circuit;
   one or more filters in a signal path of said RF circuit each based on Inductive Capacitive (LC) circuitry;
   an LC variation unit operable to measure a variation of said LC circuitry, wherein said variation of said LC circuitry comprises a difference between an actual characteristic of said LC circuitry and a nominal characteristic of said LC circuitry; and
   a frequency control unit adapted to adjust said one or more filters based at least in part on said LC variation during operation of said RF circuit.

2. The system of claim 1 wherein said one or more filters are RF filters at an input of said signal path.

3. The system of claim 1 wherein said one or more filters each include a plurality of discrete, selectable inductive and capacitive elements, and said frequency control unit is operable to select one or more of said discrete capacitive and inductive elements based at least in part on said variation to compensate for said LC variation.

4. The system of claim 1 wherein said one or more filters each include a plurality of switchable filter elements, each of said filter elements corresponding to a frequency band, and wherein said frequency control unit is operable to change frequency points at which said filter elements are switched based at least in part on said LC variation.

5. The system of claim 1 wherein said one or more filters, said LC variation unit, and said frequency control unit are formed at least in part on a same semiconductor chip.

6. The system of claim 1 wherein said system further comprises:
   an LC component formed on a same chip as said one or more filters, wherein said LC variation unit is operable to measure an LC variation for said LC component.

7. The system of claim 1 wherein said RF circuit is adapted to measure a center frequency of an Intermediate Frequency (IF) filter in said signal path and is further adapted to calculate a local oscillator frequency to control a mixer in said signal path based at least in part on said measured center frequency.

8. The system of claim 1 wherein said frequency control unit is adapted to adjust said one or more filters each time a desired RF frequency is changed.

9. The system of claim 1 wherein said RF circuit is an RF signal tuner, said system further comprising a control unit adapted to send one or more of the following to said RF circuit:
   a signal indicating a desired RF channel for processing; and
   a signal indicating a local oscillator frequency to control a mixer in said tuner.

10. A method for processing a signal with a Radio Frequency (RF) signal tuner, said method comprising:
    measuring a variation of Inductive Capacitive (LC) circuitry, wherein said variation of said LC circuitry comprises a difference between an actual characteristic of said LC circuitry and a nominal characteristic of said LC circuitry, wherein one or more filters in a signal path of said RF tuner each include LC circuitry;
    during operation of said signal tuner, making tuning adjustments based, at least in part, on said measured variation.

11. The method of claim 10 wherein said one or more filters are RF filters at an input of said signal path.

12. The method of claim 10 further comprising:
    measuring a center frequency for an Intermediate Frequency (IF) filter in said signal path; and
    generating a local oscillator frequency signal to control a mixer in said signal path based at least in part on said measured IF filter center frequency.

13. The method of claim 12 wherein said measuring said center frequency comprises:
    applying negative resistance to circuitry in said IF filter to change at least part of said IF filter into an oscillator;
    oscillating said circuitry in said IF filter;
    measuring said oscillations and calculating said IF filter center frequency therefrom.

14. The method of claim 10 wherein said one or more filters each includes switchable, discrete filter elements that each correspond to a frequency band, and wherein said making tuning adjustments comprises:
    adjusting frequency points at which said switchable, discrete filter elements are switched based at least on part on said measured LC variation.

15. The method of claim 10 wherein said one or more filters each includes selectable inductive and capacitive elements that can be selected to provide discrete frequency responses, and wherein said making tuning adjustments comprises:
    adjusting frequency points at which said selectable inductive and capacitive elements are switched based at least on part on said measured LC variation.

16. The method of claim 10 wherein measuring said variation comprises:
    operating an LC oscillator formed on a same semiconductor chip as said one or more filters;
    measuring the oscillations of said oscillator;
    calculating an LC variation from said measured oscillations.

17. The method of claim 10 further comprising:
    receiving a signal indicating a desired RF frequency; and
    performing said making tuning adjustments in response to receiving said signal.

18. The method of claim 10 wherein measuring said variation comprises:
    measuring an LC variation for LC circuitry formed on a same semiconductor chip as said one or more filters.

19. A method for operating a tuning circuit, said method comprising:
    receiving data indicative of on-chip process variation of Inductive Capacitive (LC) circuitry, wherein said variation of said LC circuitry comprises a difference between an actual characteristic of said LC circuitry and a nominal characteristic of said LC circuitry, and wherein a Radio Frequency (RF) filter unit in a signal path of an RF tuner includes LC circuitry;
    receiving data indicative of a signal for processing
    adjusting said RF filter unit as a function of said variation and of said signal for processing.

20. The method of claim 19 wherein the data indicative of said signal comprises one or more of:
    input indicating an RF channel selection;
    input indicating a local oscillator frequency to control a mixer in said signal path.

21. The method of claim 19 further comprising:
    receiving data indicative of a measured center frequency for an Intermediate Frequency (IF) filter in said signal path;
    generating a local oscillator signal based, at least in part, on said IF center frequency.

22. A system for processing a signal with a Radio Frequency (RF) signal tuner, said method comprising:
    means for measuring a variation of Inductive Capacitive (LC) circuitry, wherein said variation of said LC circuitry comprises a difference between an actual characteristic of said LC circuitry and a nominal characteristic of said LC circuitry, wherein one or more RF filters in a signal path of said RF tuner each include LC circuitry;

means for measuring a center frequency of an Intermediate Frequency (IF) filter in said signal path;

means for making tuning adjustments based, at least in part, on said measured variation during operation of said RF signal tuner; and means for generating a local oscillator frequency based, at least in part, on said measured IF filter center frequency.

23. The system of claim 22 wherein said means for measuring said variation comprises:

an LC oscillator formed on a same semiconductor chip as said one or more RF filters;

a frequency measuring circuit to measure the oscillations of said LC oscillator and to calculate said variation therefrom.

24. The system of claim 22 wherein said means for measuring a center frequency comprises:

a circuit for applying negative resistance to at least a part of said IF filter in order to change said IF filter to an oscillator;

a circuit for measuring oscillations of said IF filter and calculating said center frequency therefrom.

25. A system for processing a signal, said system comprising:

a Radio Frequency (RF) signal tuner at least partly disposed upon a semiconductor chip;

an RF filter at an input of a signal path of said RF tuner based on Inductive Capacitive (LC) circuitry;

a first mixer adapted to receive output from said RF filter, said first mixer controlled by a first local oscillator;

a first Intermediate Frequency (IF) filter adapted to receive output from said first mixer and to produce a first IF signal;

a second mixer adapted to receive said first IF signal;

a second IF filter adapted to receive output from said second mixer to produce an IF output signal;

an LC variation unit operable to measure a variation of said LC circuitry, wherein said variation of said LC circuitry comprises a difference between an actual characteristic of said LC circuitry and a nominal characteristic of said LC circuitry;

a center frequency measurement unit adapted to determine a center frequency of said first IF filter; and a frequency control unit adapted to:

adjust said RF filter based at least in part on said LC variation during operation of said tuner; and adjust a frequency of said first local oscillator based at least in part on said center frequency of said first IF filter.

* * * * *

UNITED STATES PATENT AND TRADEMARK OFFICE
CERTIFICATE OF CORRECTION

| | |
|---|---|
| PATENT NO. | : 7,636,559 B2 |
| APPLICATION NO. | : 11/513520 |
| DATED | : December 22, 2009 |
| INVENTOR(S) | : Timothy M. Magnusen et al. |

Page 1 of 1

It is certified that error appears in the above-identified patent and that said Letters Patent is hereby corrected as shown below:

Column 6, Line 3, delete the portion of text reading "RE" and replace with --RF--.

Signed and Sealed this

Ninth Day of February, 2010

David J. Kappos
*Director of the United States Patent and Trademark Office*

UNITED STATES PATENT AND TRADEMARK OFFICE
CERTIFICATE OF CORRECTION

PATENT NO. : 7,636,559 B2  Page 1 of 1
APPLICATION NO. : 11/513520
DATED : December 22, 2009
INVENTOR(S) : Magnusen et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 571 days.

Signed and Sealed this

Ninth Day of November, 2010

David J. Kappos
*Director of the United States Patent and Trademark Office*